(12) United States Patent
Kawatoko et al.

(10) Patent No.: US 11,137,269 B2
(45) Date of Patent: Oct. 5, 2021

(54) ENCODER AND SIGNAL PROCESSING CIRCUIT

(71) Applicant: MITUTOYO CORPORATION, Kanagawa (JP)

(72) Inventors: Osamu Kawatoko, Ibaraki (JP); Tomohiro Tahara, Tokyo (JP); Hirokazu Kobayashi, Saitama (JP)

(73) Assignee: MITUTOYO CORPORATION, Kanagawa (JP)

( * ) Notice: Subject to any disclaimer, the term of this patent is extended or adjusted under 35 U.S.C. 154(b) by 361 days.

(21) Appl. No.: 15/804,170

(22) Filed: Nov. 6, 2017

(65) Prior Publication Data

US 2018/0143040 A1    May 24, 2018

(30) Foreign Application Priority Data

Nov. 22, 2016    (JP) .............................. JP2016-226888

(51) Int. Cl.
*G01D 5/34* (2006.01)
*G01D 5/347* (2006.01)
(Continued)

(52) U.S. Cl.
CPC ..... *G01D 5/34707* (2013.01); *G01D 5/24428* (2013.01); *G01D 5/34715* (2013.01); *G11C 27/026* (2013.01); *G01D 5/34746* (2013.01)

(58) Field of Classification Search
CPC ........... G01D 5/24428; G01D 5/34715; G01D 5/34707; G11C 27/026
(Continued)

(56) References Cited

U.S. PATENT DOCUMENTS 4,827,116 A * 5/1989 Takagi ................ H01S 5/06832
                                                    250/205
5,172,117 A * 12/1992 Mills ....................... H03M 1/60
                                                     341/122
(Continued)

FOREIGN PATENT DOCUMENTS

CN          102331270 A      1/2012
CN          103852194 A      6/2014
(Continued)

OTHER PUBLICATIONS

Chinese Office Action (English Language Translation), dated Feb. 3, 2021 by the China National Intellectual Property Administration (CNIPA), for Chinese Patent Application No. 201711174411.2.

*Primary Examiner* — Georgia Y Epps
*Assistant Examiner* — Kevin Wyatt
(74) *Attorney, Agent, or Firm* — Greenblum & Bernstein, P.L.C.

(57) ABSTRACT

A reference voltage generator circuit generates a reference voltage corresponding to a power supply voltage. A current/voltage converter circuit converts a photocurrent output by a photoreceiver into voltage, and outputs a voltage obtained by adding the converted voltage and the reference voltage. A sample and hold circuit holds a voltage of a capacitor in response to a sample and hold signal, the capacitor having the voltage input at one end and the reference voltage input at another end. An amplifier circuit outputs an output signal where a voltage held by the sample and hold circuit is amplified with the reference voltage as a reference.

7 Claims, 8 Drawing Sheets

(51) Int. Cl.
*G01D 5/244* (2006.01)
*G11C 27/02* (2006.01)

(58) Field of Classification Search
USPC ...................................................... 250/231.1
See application file for complete search history.

(56) References Cited

U.S. PATENT DOCUMENTS

| | | | | |
|---|---|---|---|---|
| 8,279,002 | B2* | 10/2012 | Kawashima | G11B 7/13 330/144 |
| 8,309,906 | B2 | 11/2012 | Kapner et al. | |
| 9,310,269 | B2 | 4/2016 | Visser et al. | |
| 2004/0262505 | A1* | 12/2004 | Atsuta | G01D 5/36 250/231.13 |
| 2010/0260028 | A1* | 10/2010 | Kurihara | G11B 7/1263 369/100 |
| 2011/0057092 | A1* | 3/2011 | Hane | G01D 5/244 250/231.11 |
| 2011/0304482 | A1 | 12/2011 | Kapner et al. | |
| 2011/0314482 | A1 | 12/2011 | Kapner et al. | |
| 2012/0261561 | A1* | 10/2012 | Horiguchi | G01D 5/262 250/231.1 |
| 2014/0152286 | A1* | 6/2014 | Visser | G01L 9/12 323/299 |
| 2014/0266379 | A1* | 9/2014 | Inoue | H03K 5/249 327/307 |

FOREIGN PATENT DOCUMENTS

| | | |
|---|---|---|
| CN | 105222900 A | 1/2016 |
| JP | 5771070 B | 8/2015 |

\* cited by examiner

ENCODER AND SIGNAL PROCESSING CIRCUIT

CROSS-REFERENCE TO RELATED APPLICATIONS

The present application claims priority under 35 U.S.C. § 119 of Japanese Application No. 2016-226888, filed on Nov. 22, 2016, the disclosure of which is expressly incorporated by reference herein in its entirety.

BACKGROUND OF THE INVENTION

1. Field of the Invention

The present invention relates to an encoder and a signal processing circuit.

2. Description of Related Art

An encoder is installed in displacement measurement devices such as a dial gauge or indicator in order to measure an amount of displacement. A known example of such an encoder is an optical encoder that uses optical interference to measure the amount of displacement. Furthermore, encoders are broadly separated into incremental encoders, which measure a relative amount of displacement, and absolute encoders, which detect an absolute position. The specification of Japanese Patent No. 5,771,070, for example, suggests a configuration for an absolute-type optical encoder.

In an exemplary optical encoder, illumination light from a light-emitting element such as a light-emitting diode is shone onto a scale, and the light that passes through the scale is received by a photoreceiver element such as a photodiode provided to a photoreceiver. An absolute-type optical encoder is suggested as an example of such an encoder (e.g., in the specification of Japanese Patent No. 5,771,070). In such an absolute-type optical encoder, photocurrent generated by a photodiode is converted to a voltage signal by a current/voltage converter circuit and the converted voltage signal is processed by a signal processing circuit. The signal processing circuit is mounted in an absolute position detector circuit, which detects an amount of displacement of a scale and calculates an absolute position.

An exemplary signal processing circuit in the above-noted optical encoder is now described. FIG. 7 illustrates an exemplary configuration of a signal processing circuit that converts a photocurrent of a photoreceiver element into a voltage signal and processes the voltage signal. A signal processing circuit 600 shown in FIG. 7 includes a reference voltage generator circuit 61, a current/voltage converter circuit 62, a sample and hold circuit 63, and an amplifier circuit 64.

The reference voltage generator circuit 61 generates a reference voltage REF on the basis of a power supply voltage VDD. As shown in FIG. 7, the reference voltage generator circuit 61 includes a resistor R61, a resistor R62, and an operational amplifier A61. The resistor R61 and the resistor R62 are serially connected in this order between the power supply voltage VDD and a ground GND, and the reference voltage REF, which is a division of the power supply voltage VDD, is output from a node between the resistor R61 and the resistor R62. The reference voltage REF output from a voltage dividing resistor configured by the resistor R61 and the resistor R62 is input to a non-inverting input terminal of the operational amplifier A61. An inverting input terminal and an output terminal of the operational amplifier A61 are connected as voltage followers, and the reference voltage REF is output from the output terminal.

The current/voltage converter circuit 62 converts a photocurrent Ipda flowing to a photoreceiver element 65 into a voltage Viva. As shown in FIG. 7, the current/voltage converter circuit 62 includes an operational amplifier A62, a resistor R63, and a capacitor C61. The reference voltage REF output by the reference voltage generator circuit 61 is input to a non-inverting input terminal of the operational amplifier A62. An inverting input terminal of the operational amplifier A62 is connected to a cathode of the photoreceiver element 65. In addition, the resistor R63 and the capacitor C61 are connected in parallel between the inverting input terminal and an output terminal of the operational amplifier A62. With the above configuration, the photocurrent Ipda flowing to the photoreceiver element 65 is converted into the voltage signal Viva, and the voltage signal Viva is output from the output terminal of the operational amplifier A62.

The sample and hold circuit 63 holds the voltage signal Viva output from the current/voltage converter circuit 62, in response to a sample and hold signal. As shown in FIG. 7, the sample and hold circuit 63 includes an operational amplifier A63, a capacitor C62, and a switch SW1. The switch SW1 is inserted between an output terminal of the current/voltage converter circuit 62 (that is, the output terminal of the operational amplifier A62) and a non-inverting input terminal of the operational amplifier A63. The switch SW1 is configured to be capable of opening and closing in response to a sample and hold signal SH. One end of the capacitor C62 is connected between the switch SW1 and the non-inverting input terminal of the operational amplifier A63. Another end of the capacitor C62 is connected to the ground GND. An inverting input terminal and an output terminal of the operational amplifier A63 are connected as voltage followers, and the voltage signal VH, at which the voltage signal Viva is held, is output from the output terminal.

Taking the reference voltage REF output by the reference voltage generator circuit 61 as a reference, the amplifier circuit 64 amplifies the voltage signal VH held by the sample and hold circuit 63 and outputs the amplified voltage as an output signal VOUT. As shown in FIG. 7, the amplifier circuit 64 includes an operational amplifier A64, a resistor R64, and a resistor R65. The reference voltage REF output by the reference voltage generator circuit 61 is input to a non-inverting input terminal of the operational amplifier A64. The resistor R64 is inserted between an output terminal of the sample and hold circuit 63 (that is, the output terminal of the operational amplifier A63) and an inverting input terminal of the operational amplifier A64. The resistor R65 is inserted between an output terminal of the operational amplifier A64, and a space between the resistor R64 and the inverting input terminal of the operational amplifier A64. Accordingly, the output signal VOUT is output from the output terminal of the operational amplifier A64 as the reference voltage REF, the output signal VOUT having the voltage held by the sample and hold circuit 63 amplified.

Next, operations of the signal processing circuit 600 are described. Prior to a time T0, a level of the sample and hold signal SH is HIGH and the switch SW1 of the sample and hold circuit 63 is closed. Accordingly, the voltage Viva is input to the sample and hold circuit 63.

Then, at the time T0, when the level of the sample and hold signal SH transitions from HIGH to LOW, the switch SW1 of the sample and hold circuit 63 is opened. At this point, the sample and hold circuit 63 holds the voltage Viva of time T0 (Viva(T0)=VH).

At this point, the voltage Viva output by the current/voltage converter circuit 62 is reviewed. The voltage signal VH at the time (T0) is expressed by the following Formula [1].

$$VH = Ipda \cdot R1 + REF(T0) \quad [1]$$

In the present configuration, the output signal VOUT of the amplifier circuit 64 after the sample and hold is expressed by the following Formula [2], with a gain designated as G.

$$VOUT = G(VH - REF) + REF = G(Ipda \cdot R1 + REF(T0) - REF) + REF \quad [2]$$

In the signal processing circuit 600 described above, the reference voltage REF is generated by dividing the power supply voltage VDD. However, the power supply voltage VDD may vary, and as a result the reference voltage REF may also vary in response to the variation in the power supply voltage VDD. Specifically, in the signal processing circuit 600 described above, as shown in Formula [2], a value for the reference voltage REF that varies over time may result in a value that is different from a value REF(T0) of the reference voltage at the time T0. As a result, the output signal VOUT is dependent on the reference voltage REF and not only does a second element on a right side (indicating the offset) vary, but a first element on the right side, which is multiplied by the gain G, also varies. This acts as variation in the gain of the output signal VOUT, and therefore a change in the photocurrent of the photoreceiver element 65 cannot be accurately assessed. As a result, accuracy of position detection using the output signal VOUT is reduced.

Moreover, in a configuration using four-phase signals, as in the specification of Japanese Patent No. 5,771,070 for example, a favorable configuration includes four groups of the above-described current/voltage converter circuit 62, sample and hold circuit 63, and photoreceiver element 65, and inputs the signals from these groups to the amplifier circuit 65 via a switch circuit. However, even when sampling is carried out at the same point in time for each of the four groups, in order for each phase to be selectively reflected by the switch circuit, an arithmetic operation timing of each phase differs for the output signal VOUT reflecting each phase. As a result, even the reference voltage used in an arithmetic operation for each phase differs, and therefore the result is that position detection accuracy decreases.

In contrast, the reference voltage and the voltage signal obtained by converting the photocurrent of the photoreceiver element can be held at the same point in time and compared, and thereby variation in the output signal can be inhibited. FIG. 8 illustrates another exemplary configuration of a signal processing circuit that converts a photocurrent of a photoreceiver element into a voltage signal and processes the voltage signal. A signal processing circuit 700 shown in FIG. 8 has a configuration in which a sample and hold circuit 66 is added to the signal processing circuit 600 described above.

The sample and hold circuit 66 holds the reference voltage REF output from the reference voltage generator circuit 61, in response to a sample and hold signal. As shown in FIG. 8, the sample and hold circuit 66 includes an operational amplifier A66, a capacitor C63, and a switch SW2. The switch SW2 is inserted between an output terminal of the reference voltage generator circuit 61 (that is, the output terminal of the operational amplifier A61) and a non-inverting input terminal of the operational amplifier A66. The switch SW2 is configured to be capable of opening and closing in response to the sample and hold signal SH. One end of the capacitor C63 is connected between the switch SW2 and the non-inverting input terminal of the operational amplifier A66. Another end of the capacitor C63 is connected to the ground GND. An inverting input terminal and an output terminal of the operational amplifier A66 are connected as voltage followers, and a reference voltage REFH, at which the reference voltage REF is held, is output from the output terminal to a non-inverting input terminal of the amplifier circuit 64.

Next, operations of the signal processing circuit 700 are described. Prior to the time T0, the level of the sample and hold signal SH is HIGH, and the switch SW1 of the sample and hold circuit 63 and the switch SW2 of the sample and hold circuit 66 are closed. Accordingly, the voltage Viva is input to the sample and hold circuit 63, and the reference voltage REF is input to the sample and hold circuit 66.

Then, at the time T0, when the level of the sample and hold signal SH transitions from HIGH to LOW, the switch SW1 of the sample and hold circuit 63 and the switch SW2 of the sample and hold circuit 66 are opened. At this point, the sample and hold circuit 63 holds the voltage Viva of time T0 (Viva(T0)=VH), and the sample and hold circuit 66 holds a reference voltage REFH of time T0.

At this point, the voltage Viva output by the current/voltage converter circuit 62 is reviewed. The voltage signal VH at the time (T0) is expressed by the following Formula [3].

$$VH = Ipda \cdot R1 + REFH \quad [3]$$

In addition, the output signal VOUT of the amplifier circuit 64 after the sample and hold is expressed by the following Formula [4], with the gain designated as G.

$$VOUT = G(VH - REFH) + REFH \quad [4]$$

As expressed by Formula [4], the reference voltage REF and the reference voltage REFH output by the sample and hold circuit 66 have an identical value that is sampled at the same point in time. Accordingly, even when the reference voltage REF varies at or after the time T0, the amplifier circuit 64 can output a constant output signal VOUT without being affected by variation in the reference voltage REF.

Although an effect of variation in the power supply voltage or the reference voltage can be inhibited by using two sampling circuits as described above, the sample and hold circuit uses an operational amplifier or the like having a comparatively large circuit scale, and therefore there is an issue that the scale of the signal processing circuit increases.

In addition, similar to the case of the signal processing circuit 600, in order to perform position detection with an encoder, the output signal VOUT output from the signal processing circuit 700 is used in an arithmetic operation carried out with another arithmetic operation device. However, during the arithmetic operation, the output signal VOUT may be compared with, for example, the reference voltage REF. At this point, although the output signal VOUT is not affected by variation in the reference voltage REF, it is conceivable that the reference voltage REF (to which the output signal VOUT is compared by the other arithmetic operation device) may vary from the time T0 value due to variation in the power supply voltage. In such a case, a result of comparing the output signal VOUT with the reference voltage REF may be affected by the variation in the reference voltage REF. In addition, in a case where the output signal is converted to a digital signal by an external analog/digital (AD) converter, the power supply voltage may be designated as the reference voltage. As a result, there may be an effect from variation in the power supply voltage. As noted above, even in a configuration corresponding to the four-phase signals, although the output voltage for each phase can be made constant, the reference voltage REF (to which the output voltage is compared during the arithmetic operation) varies, and therefore a reduction in position detection accuracy due to differences in arithmetic operation timing is unavoidable.

Given the above, it may be understood that in a case where an output signal of a signal processing circuit is used by another arithmetic operation device or the like, the output signal of the signal processing circuit preferably varies in accordance with variation in a power supply voltage or a reference voltage.

SUMMARY OF THE INVENTION

The present invention was conceived in light of the circumstances above, and the present invention achieves highly accurate position detection in an optical encoder, independent of variation in power supply voltage, through a simple configuration.

An encoder according to an aspect of the present invention includes a light source, a scale receiving light from the light source, a photoreceiver receiving the light from the scale and outputting a signal corresponding to the received light, and a signal processing circuit calculating a positional relationship between the photoreceiver and the scale in accordance with the signal from the photoreceiver. The signal processing circuit includes a reference voltage generator circuit, a current/voltage converter circuit, a sample and hold circuit, and an amplifier circuit. The reference voltage generator circuit generates a reference voltage corresponding to a power supply voltage. The current/voltage converter circuit converts a photocurrent output by a photoreceiver element into voltage, and outputs a voltage signal obtained by adding the converted voltage and the reference voltage. The sample and hold circuit holds a voltage of a first capacitor in response to a sample and hold signal, the first capacitor having the voltage signal output from the current/voltage converter circuit input at one end and the reference voltage input at another end, the voltage of the first capacitor being voltage at an end on a side where the voltage signal is input. The amplifier circuit outputs an output signal where the voltage held by the sample and hold circuit is amplified with the reference voltage as a reference.

An encoder according to another aspect of the present invention is the encoder described above, in which the sample and hold circuit includes: a switch, to one end of which the voltage signal output from the current/voltage converter circuit is input, the switch opening and closing synchronously with the sample and hold signal; and a first operational amplifier where one input terminal and an output terminal are connected, and another input terminal is connected to another end of the switch and to one end of the first capacitor. A voltage of the output terminal of the first operational amplifier when the switch is open is output as the held voltage.

An encoder according to another aspect of the present invention is the encoder described above, in which the current/voltage converter circuit includes: a second operational amplifier where the reference voltage is input to one input terminal, another input terminal is connected to one end of the photoreceiver element, and the voltage signal is output from an output terminal; and a second capacitor and first resistor connected in parallel between the input terminal of the second operational amplifier that is connected to the photoreceiver element, and the output terminal of the second operational amplifier. The amplifier circuit includes: a second resistor having one end connected to the output terminal of the first operational amplifier; a third operational amplifier where the reference voltage is input to one input terminal and the output signal is output from an output terminal; and a third resistor having one end connected to the output terminal of the third operational amplifier. Another input terminal of the third operational amplifier is connected to another end of the second resistor and another end of the third resistor.

An encoder according to another aspect of the present invention is the encoder described above, in which the reference voltage generator circuit includes a fourth resistor having the power supply voltage input to one end; a fifth resistor having a fixed voltage that is lower than the power supply voltage input to one end; and a fourth operational amplifier having one input terminal connected to another end of the fourth resistor and another end of the fifth resistor, having another input terminal connected to an output terminal, and outputting the reference voltage from the output terminal.

A signal processing circuit according to another aspect of the present invention includes a reference voltage generator circuit, a current/voltage converter circuit, a sample and hold circuit, and an amplifier circuit. The reference voltage generator circuit generates a reference voltage corresponding to a power supply voltage. The current/voltage converter circuit converts a photocurrent output by a photoreceiver element into voltage, and outputs a voltage signal obtained by adding the converted voltage and the reference voltage. The sample and hold circuit holds a voltage of a first capacitor in response to a sample and hold signal, the first capacitor having the voltage signal output from the current/voltage converter circuit input at one end and the reference voltage input at another end, the voltage of the first capacitor being voltage at an end on a side where the voltage signal is input. The amplifier circuit outputs an output signal where the voltage held by the sample and hold circuit is amplified with the reference voltage as a reference.

According to the present invention, highly accurate position detection in an optical encoder can be achieved, independent of variation in power supply voltage, through a simple configuration.

The present invention is clarified by the following detailed description and the appended drawings. The appended drawings are referenced only to facilitate understanding and do not serve to limit the present invention.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

Figure 1:
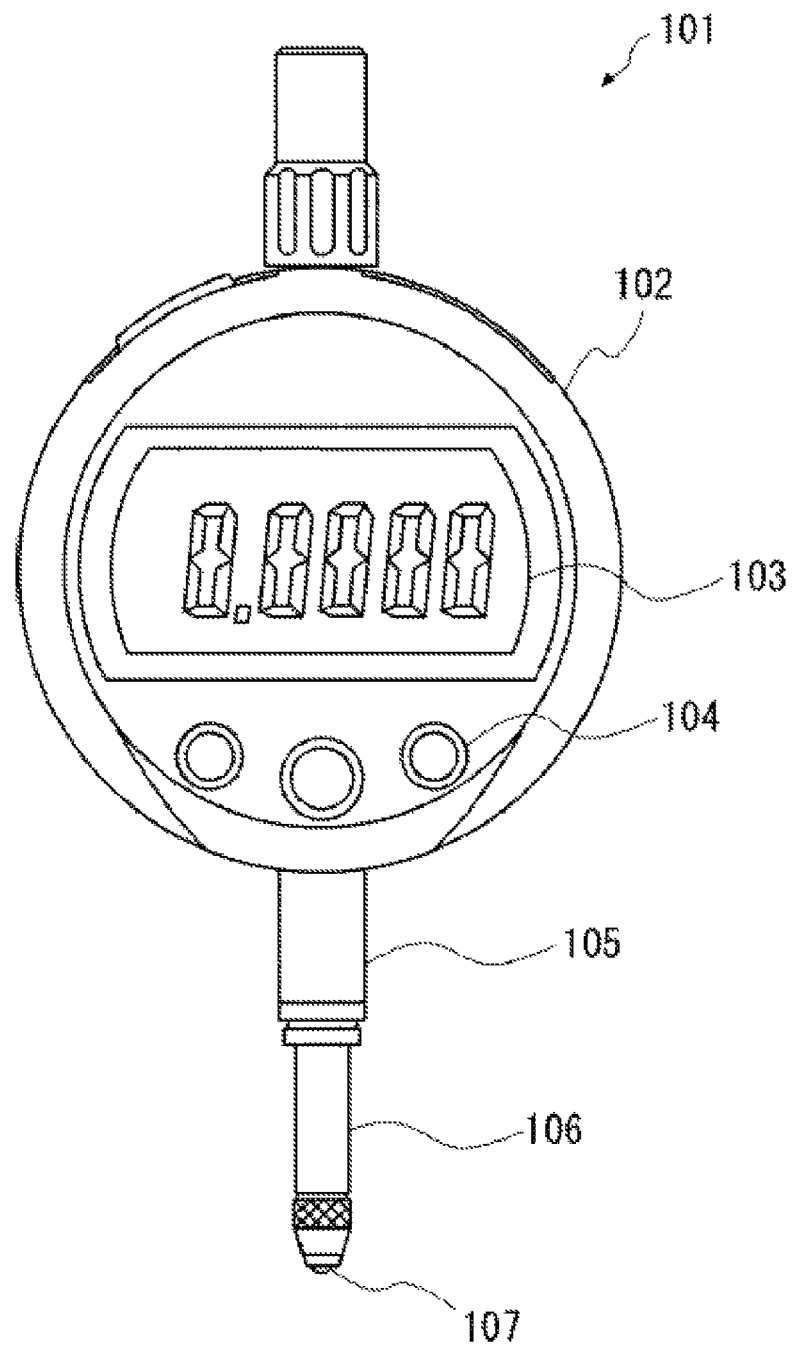
FIG. 1 is a front view schematically illustrating a configuration of a dial gauge that incorporates an optical encoder according to a first embodiment.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Hereafter, embodiments of the present invention are described with reference to the drawings. Identical reference numerals are assigned to identical elements in each of the plurality of drawings, and duplicative descriptions are omitted where necessary.

First Embodiment

An optical encoder according to a first embodiment is described. FIG. 1 is a front view schematically illustrating a configuration of a dial gauge 101 that incorporates the optical encoder according to the first embodiment. The dial gauge 101 includes a main body 102, a display 103, an operation button 104, a stem 105, a spindle 106, a stylus head 107, and an output port 108.

The main body 102 has a substantially rounded pillar shape where the height in the vertical direction of the drawing plane of FIG. 1 is less than the width in the horizontal direction of the drawing plane of FIG. 1. The display 103 displaying a measured value, for example, is provided on one surface of the main body 102.

The stem 105 has a substantially cylindrical shape, and is provided so as to project from an exterior edge of the main body 102.

The spindle 106 is a substantially cylindrical member, is inserted through the stem 105, and is supported so as to be capable of sliding in a length direction of the stem 105. The stylus head 107, which makes contact with a measured object, is joined to a forefront end of the spindle 106 projecting from the stem 105.

A displacement amount detector (not shown in the drawings) detecting an amount of displacement of the spindle 106 is provided inside the main body 102. In order to detect the amount of displacement, the displacement amount detector includes an optical encoder 10 (described below), and using the optical encoder 10, the amount of displacement of the spindle 106 is detected on a fixed cycle and output to the display 103. The display 103 is configured to be capable of displaying measurement results output from the displacement amount detector.

The operation button 104 is used to reset the measurement results displayed on the display 103, to switch a display range, or the like. In this example, three operation buttons 104 are provided, but the number of operation buttons 104 is not limited to this.

The output port 108 is configured to enable connection of an external device, and can output measurement results to an exterior, for example.

Figure 2:
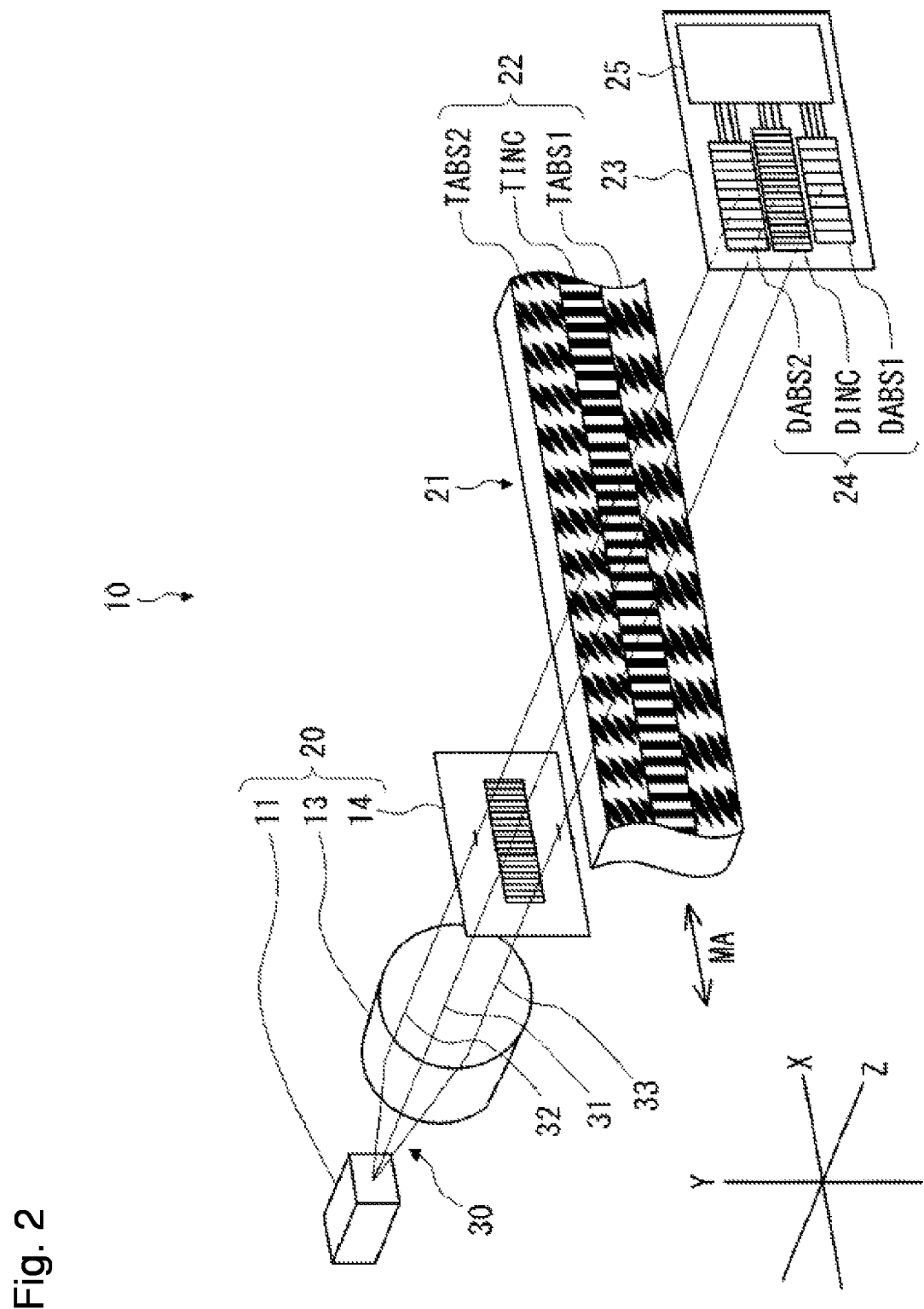
FIG. 2 is a development plan illustrating a schematic configuration of the optical encoder according to the first embodiment.

The optical encoder 10 according to the first embodiment is described next. In the present embodiment, the optical encoder 10 is configured as an absolute optical encoder that uses a dual-modulation scale track pattern (hereafter referred to as a DMST pattern). FIG. 2 is a development plan illustrating a schematic configuration of the optical encoder 10 according to the first embodiment. As shown in FIG. 2, the optical encoder 10 includes an illuminator 20, a scale 21, and a signal detector 23.

The illuminator 20 and the signal detector 23 are arranged so as to have fixed relative positions. The signal detector 23 and the illuminator 20 are configured to be capable of relative displacement, relative to the scale 21, along a measurement direction (X axis direction in FIG. 2), which is a length direction of the scale 21. The scale 21 is provided with an absolute scale pattern 22 used in position detection. When the illuminator 20 fires light at the absolute scale pattern 22, interference light is generated. By detecting a change in the measurement direction of the interference light, the signal detector 23 can detect a positional relationship between the scale 21 and the signal detector 23.

The illuminator 20 is configured as a component illuminating the scale 21 with a visible or non-visible wavelength. The illuminator 20 includes, for example, a light source 11, a lens 13, and a light source lattice 14. The light source 11 is configured to be capable of emitting light of a visible or non-visible wavelength. The light source 11 is connected to a signal processing circuit 25 described below, and behaves as a light source that intermittently fires light on a fixed cycle. Light 30 fired from the light source 11 is either partially or fully converted to parallel light beams by the lens 13, so as to have a sufficient beam area for illuminating a predetermined region of the scale 21. The light source lattice 14 renders the parallel light beams from the lens 13 into uniform illuminance in the measurement direction, after which the parallel light beams reach the scale 21. In a case where an illumination distribution of the parallel light beams from the lens 13 is sufficiently uniform, an illuminator not having the light source lattice 14 may be provided.

The scale 21 includes the absolute scale pattern 22. The absolute scale pattern 22 is configured by an incremental track pattern TINC, an absolute track pattern TABS1, and an absolute track pattern TABS2. The DMST pattern named above can be used as the absolute track pattern TABS1 and as the absolute track pattern TABS2.

The plane of the scale 21 on which the absolute scale pattern 22 is formed is the plane parallel to the X direction (measurement direction) and Y direction (perpendicular to the X direction). In FIG. 2, the measurement direction is depicted with reference sign MA. In addition, in FIG. 1, the direction perpendicular to the plane of the scale 21 on which the absolute scale pattern 22 is formed, i.e., the X-Y plane, is designated as the Z direction.

The signal detector 23 includes a detector track 24 and the signal processing circuit 25. The signal detector 23 can be configured as a single complementary metal oxide semiconductor (CMOS) integrated circuit, for example. The detector track 24 includes three detector tracks DINC, DABS1, and DABS2. The detector tracks DINC, DABS1, and DABS2 are arranged so as to receive patterned light from the incremental track pattern TINC, absolute track pattern TABS1, and absolute track pattern TABS2, respectively. The signal processing circuit 25 is configured as a circuit that processes a signal indicating detection results of the detector track 24.

As noted above, the light 30 fired from the light source 11 is converted to parallel light beams by the lens 13. In FIG. 1, three optical paths 31, 32, and 33 of the light 30 are illustrated schematically. The optical path 31 is a representative central optical path that includes light illuminating the incremental track pattern TINC. The optical paths 32 and 33 are representative optical paths that include light illuminating the absolute track patterns TABS2 and TABS1, respectively.

In a case where the light source lattice 14 is used, the light source lattice 14 has a lattice structure that includes openings where the light around the representative optical path 31 is arranged at the pitch of the incremental track pattern TINC or at a pitch that largely conforms to the wavelength. The parallel light beams from the lens 13 pass through the lattice structure of the light source lattice 14 and strike the incremental track pattern TINC according to what is known as the self-imaging illumination principle.

When the incremental track pattern TINC is illuminated, a spatially modulated light pattern (for example, light in an interference fringe for the plurality of diffracted light) is output toward the detector track DINC of the signal detector 23. For example, when the track has a track wavelength of approximately 8 µm or less, the incremental track pattern TINC is configured such that the plurality of diffracted light (for example, ±1-dimensional diffracted light) generates an interference fringe on the detector track DINC. In addition, when the track has a track wavelength of approximately 8 to 40 µm, for example, the incremental track pattern TINC is configured such that several diffracted lights act on one another and a self-image (for example, a Talbot image or Fresnel image) is generated on the plane of the detector track DINC.

The absolute track patterns TABS2 and TABS1 are configured so as to generate an image (for example, a blurry or non-blurry image) projected onto the detector tracks DABS2 and DABS1, respectively. When the absolute track pattern TABS1 is illuminated, a spatially modulated light pattern (for example, patterned light corresponding to the absolute track pattern TABS1) is output toward the detector track DABS1 of the signal detector 23. When the absolute track pattern TABS2 is illuminated, a spatially modulated light pattern (for example, patterned light corresponding to the absolute track pattern TABS2) is output toward the detector track DABS2 of the signal detector 23.

The spatially modulated light pattern displaces together with the scale 21. In order to obtain a desired detection signal with each of the detector tracks DINC, DABS1, and DABS2, a plurality of light detector regions are arrayed, for example, such that the spatially modulated light pattern can be spatially filtered and detected. The plurality of detector regions may be configured by arraying the plurality of light detectors in the measurement direction, or may be achieved by causing light to strike a light detector having a large surface area through a spatial filter mask provided with a plurality of openings in the measurement direction.

The configurations of the track patterns depicted in FIG. 2 are merely exemplary, and so long as the pattern can be detected by the detector track, other configurations and arrangements can, of course, be employed.

Figure 3:
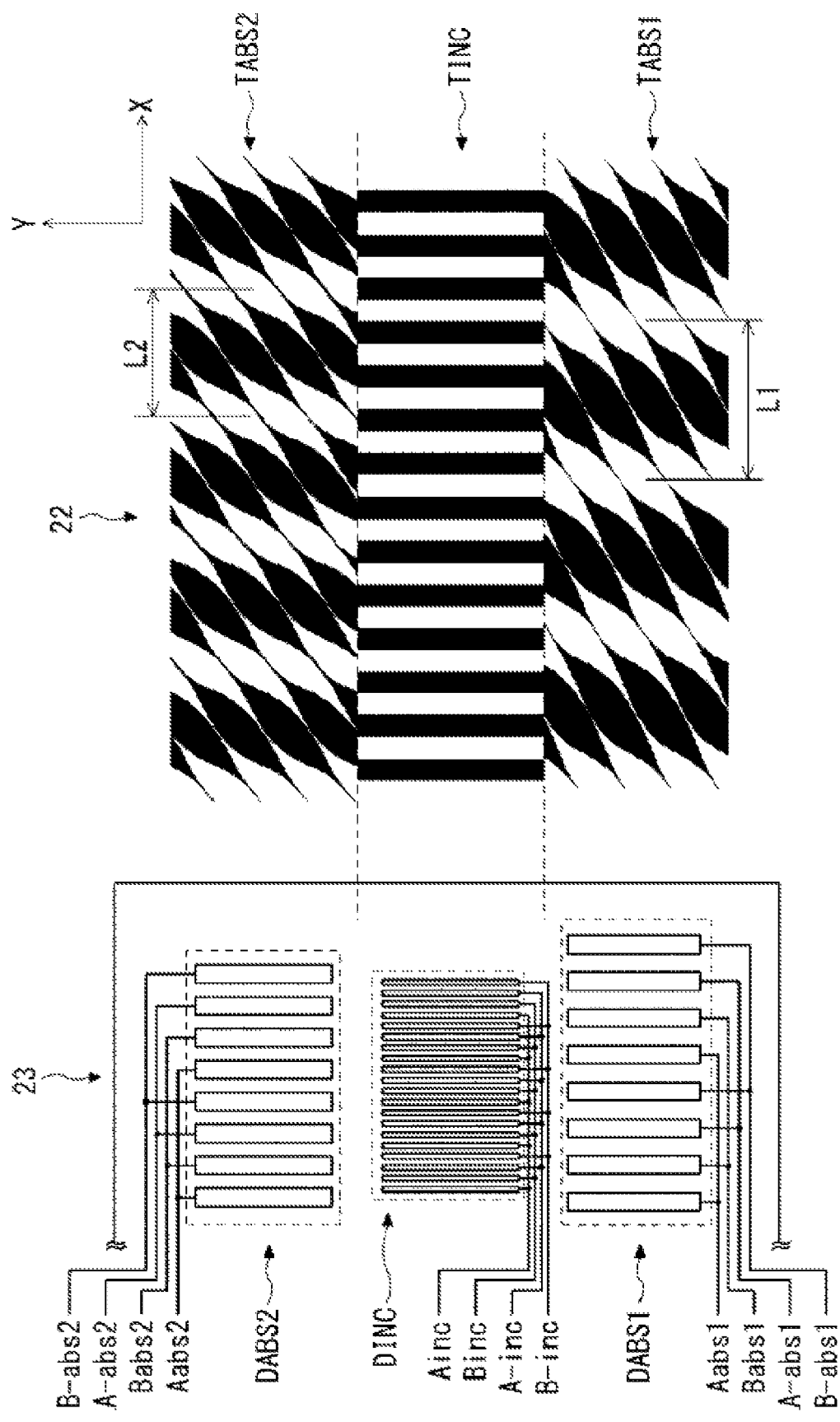
FIG. 3 illustrates a configuration of an absolute scale pattern and a signal detector.

Next, a more detailed description of the absolute scale pattern 22 and the signal detector 23 follow. FIG. 3 illustrates the configurations of the absolute scale pattern 22 and the signal detector 23. To facilitate the description, in FIG. 3, the signal detector 23 and absolute scale pattern 22 are depicted alongside each other, viewing the X-Y plane along the Z direction.

In FIG. 3, the spatial wavelength of the absolute track pattern TABS1 is L1 and the spatial wavelength of the absolute track pattern TABS2 is L2. The absolute track pattern TABS1 and the absolute track pattern TABS2 are provided with a pattern that is transparent to (or reflects) a light pattern that is spatially modulated for intensity. Such a pattern is configured such that a Y-direction width (cross-sectional dimension) changes as a function of a position along the measurement direction MA (X direction).

Each of the detector tracks DINC, DABS1, and DABS2 have a plurality of light detectors arranged so as to configure a quadrature detector, for example. In this example, each of the detector tracks have four adjacent detector elements arranged at equal intervals so as to create a spatial filter detecting four spatial phases (specifically, 0°, 90°, 180°, and 270°) of the spatially modulated light pattern received. A plurality of groups of four adjacent detector elements arranged in this way are provided and, as shown in FIG. 3, signals from the plurality of groups and associated with each of the spatial phases are added up. The totaled signals are indicated using four symbols: A (0°), B (90°), A− (180°), and B− (270°). Specifically, the four quadrature signals corresponding to the detector track DINC are designated as signals Ainc, Binc, A-inc, and B-inc. Similarly, the four quadrature signals of the detector track DABS1 are designated as signals Aabs1, Babs1, A-abs1, and B-abs1, and the four quadrature signals of the detector track DABS2 are designated as signals B-abs2, A-abs2, Babs2, and Aabs2.

The quadrature signals are processed so as to determine a spatial phase position of each track within a current local wavelength of the corresponding scale track. In particular, when at least one of the absolute track pattern TABS1 and the absolute track pattern TABS2 is a DMST pattern that includes a characteristic imparting a spatially modulated light pattern that includes an intensity modulation component, signals are obtained that correspond to the four spatial phases (i.e., 0°, 90°, 180°, and 270°) of the intensity modulation component.

By performing signal processing similar to that in Japanese Patent No. 5,771,070, for example, on the quadrature signals derived from the absolute track pattern TABS1 (wavelength L1) and the absolute track pattern TABS2 (wavelength L2), a composite wavelength position signal can be obtained that varies periodically by a composite wavelength S.

$$S = L1 \times L2 / |L1 - L2|$$

Also, again similarly to Japanese Patent No. 5,771,070, a broad range position signal can be obtained that exhibits variation having a longer periodicity than, or that is gentler than, the composite wavelength S. Given the above, by combining the broad range position signal and the composite wavelength signal, an absolute position can be exactingly measured.

In one example, the total width of the absolute scale pattern 22 can be set to approximately 3.0 mm or less. The wavelength L2 of the absolute track pattern TABS2 can be set to L2=720 µm, and the wavelength L1 of the absolute track pattern TABS1 can be set to L1=700 µm. The wavelength of the incremental track pattern TINC can be set to 20 µm. According to Japanese Patent No. 5,771,070, a composite wavelength of approximately 25.2 mm can thus be obtained. The configurations and dimensions given in the preceding case are merely exemplary, and the present invention is not limited to these.

Next, a description is given of a signal processing circuit 100 according to the first embodiment. The signal processing circuit 100 corresponds to the signal processing circuit 25 described above, and herein the description focuses on a portion of the signal processing circuit 100 that outputs a voltage signal that is based on a photocurrent of a photoreceiver element. In other words, the configuration of the signal processing circuit is not limited to the configuration in the following description, and other circuits or the like may be provided that are used to perform position detection in an encoder.

Figure 4:
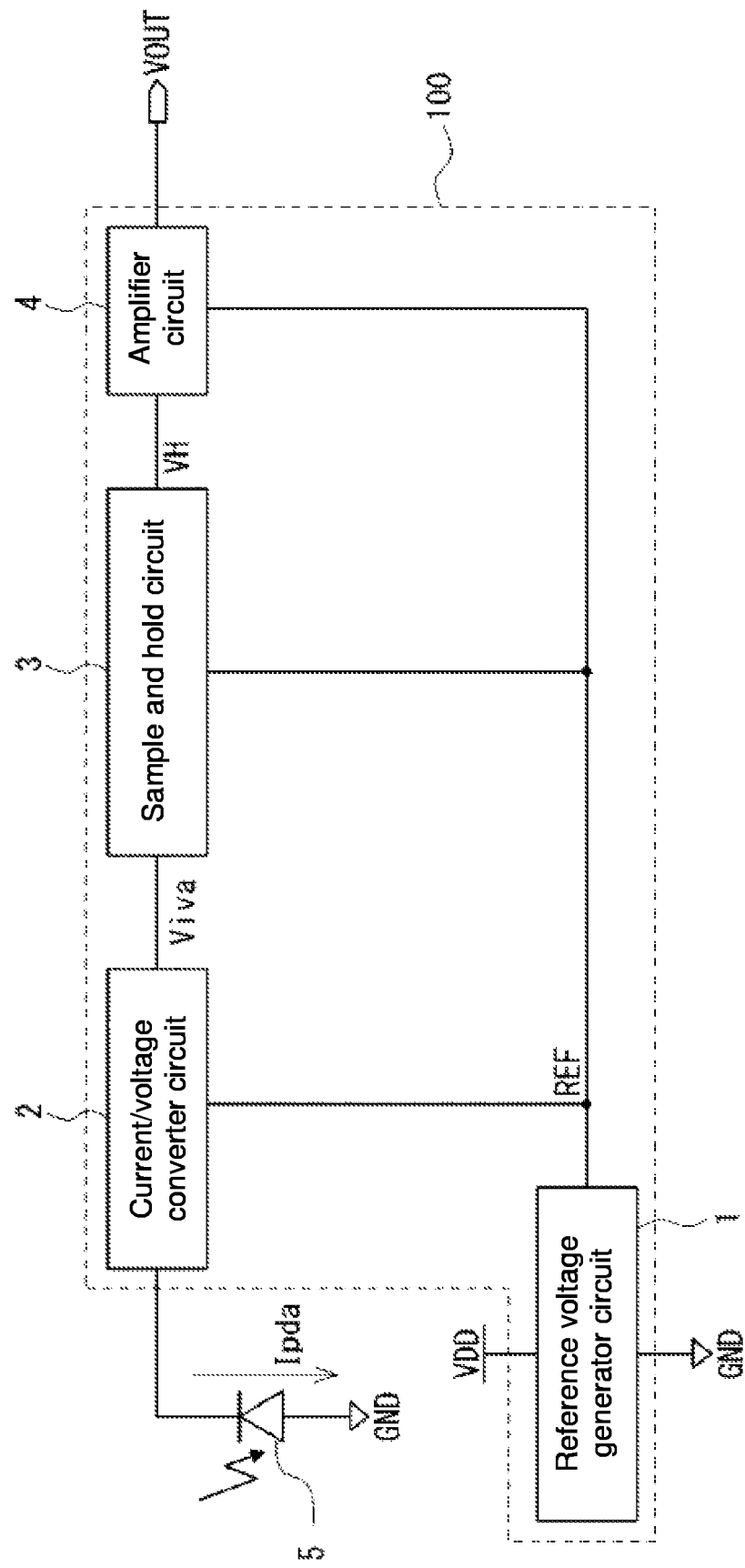
FIG. 4 is a block diagram schematically illustrating a configuration of a signal processing circuit according to the first embodiment.
Figure 5:
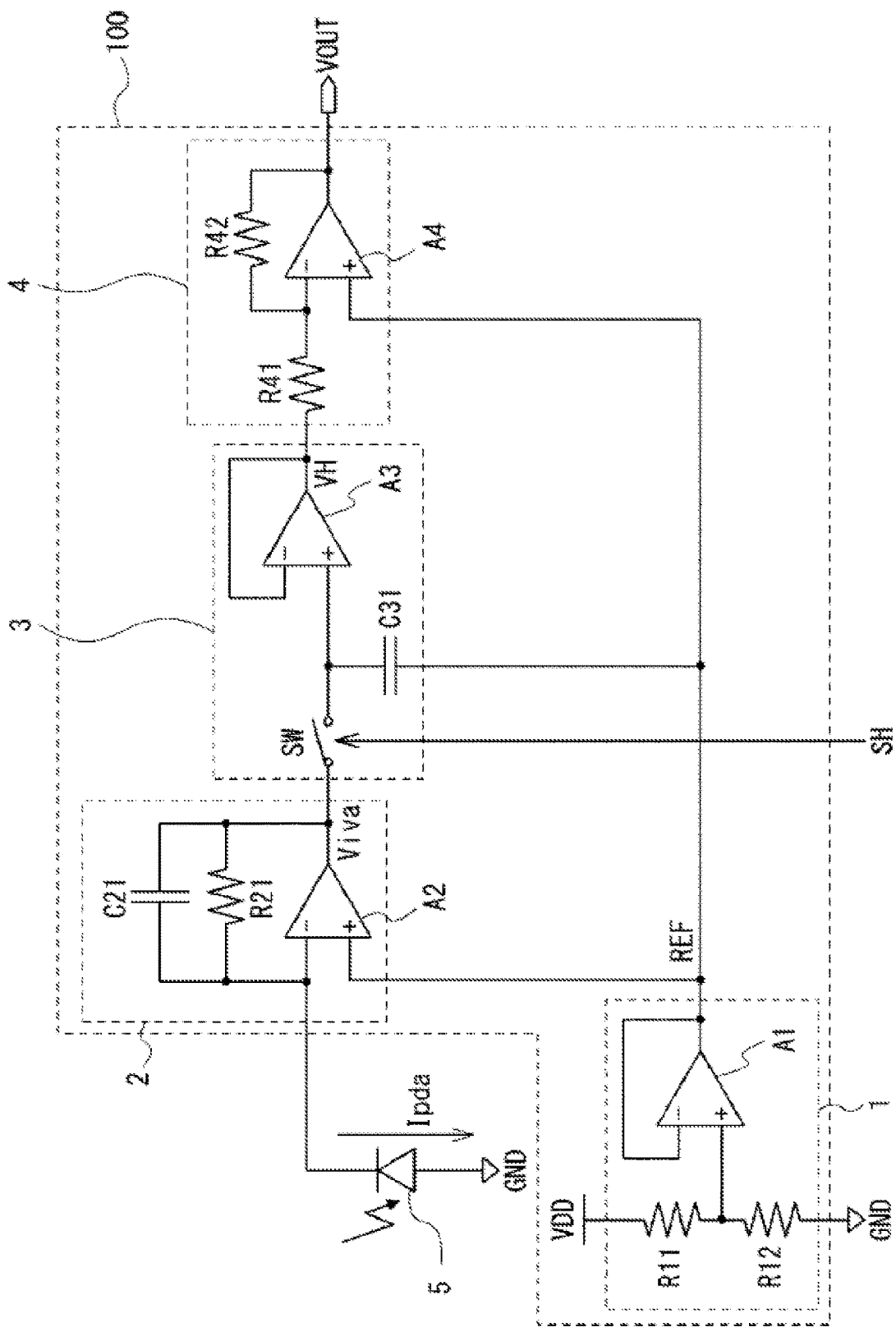
FIG. 5 is a circuit diagram illustrating further details of a configuration of the signal processing circuit according to the first embodiment.

FIG. 4 is a block diagram schematically illustrating a configuration of the signal processing circuit 100 according to the first embodiment. FIG. 5 is a circuit diagram illustrating further details of the configuration of the signal processing circuit 100 according to the first embodiment. The signal processing circuit 100 includes a reference voltage generator circuit 1, a current/voltage converter circuit 2, a sample and hold circuit 3, and an amplifier circuit 4.

The reference voltage generator circuit 1 generates a reference voltage REF on the basis of a power supply voltage VDD. As shown in FIG. 5, the reference voltage generator circuit 1 includes a resistor R11 (also called a fourth resistor), a resistor R12 (also called a fifth resistor), and an operational amplifier A1 (also called a fourth operational amplifier). The resistor R11 and the resistor R12 are serially connected in this order between the power supply voltage VDD and a ground GND, and the reference voltage REF, which is a division of the power supply voltage VDD, is output from a node between the resistor R11 and the resistor R12. The reference voltage REF output from a voltage dividing resistor configured by the resistor R11 and the resistor R12 is input to a non-inverting input terminal of the operational amplifier A1. An inverting input terminal and an output terminal of the operational amplifier A1 are connected as voltage followers, and the reference voltage REF is output from the output terminal.

The current/voltage converter circuit 2 converts a photocurrent Ipda flowing to the photoreceiver element 5 into a voltage signal Viva. As shown in FIG. 5, the current/voltage converter circuit 2 includes an operational amplifier A2 (also called a second operational amplifier), a resistor R21 (also called a first resistor), and a capacitor C21 (also called a second capacitor). The reference voltage REF output by the reference voltage generator circuit 1 is input to a non-inverting input terminal of the operational amplifier A2. An inverting input terminal of the operational amplifier A2 is connected to a cathode of the photoreceiver element 5. In addition, the resistor R21 and the capacitor C21 are connected in parallel between the inverting input terminal and an output terminal of the operational amplifier A2. With the above configuration, the photocurrent Ipda flowing to the photoreceiver element 5 is converted into the voltage signal Viva, and the voltage signal Viva is output from the output terminal of the operational amplifier A2.

The sample and hold circuit 3 holds the voltage signal Viva output from the current/voltage converter circuit 2, in response to a sample and hold signal. As shown in FIG. 5, the sample and hold circuit 3 includes an operational amplifier A3 (also called a first operational amplifier), a capacitor C31 (also called a first capacitor), and a switch SW. The switch SW is inserted between an output terminal of the current/voltage converter circuit 2 (that is, the output terminal of the operational amplifier A2) and a non-inverting input terminal of the operational amplifier A3. The switch SW is configured to be capable of opening and closing in response to a sample and hold signal SH. One end of the capacitor C31 is connected between the switch SW and the non-inverting input terminal of the operational amplifier A3. Another end of the capacitor C31 is connected to an output terminal of the reference voltage generator circuit 1 (in other words, to the output terminal of the operational amplifier A1), and the reference voltage REF is input thereto. Sample and hold operations of the sample and hold circuit 3 are described below.

The amplifier circuit 4 is configured as an inverting amplifier with offset that amplifies the voltage held by the sample and hold circuit 3 and outputs the amplified voltage as an output signal VOUT. In this example, the reference voltage REF that is output from the reference voltage generator circuit 1 is input as the offset. As shown in FIG. 5, the amplifier circuit 4 includes an operational amplifier A4 (also called a third operational amplifier), a resistor R41 (also called a second resistor), and a resistor R42 (also called a third resistor). The reference voltage REF output from the reference voltage generator circuit 1 is input as the offset voltage to a non-inverting input terminal of the operational amplifier A4. The resistor R41 is inserted between an output terminal of the sample and hold circuit 3 (that is, an output terminal of the operational amplifier A3) and an inverting input terminal of the operational amplifier A4. The resistor R42 is inserted between an output terminal of the operational amplifier A4, and a space between the resistor R41 and the inverting input terminal of the operational amplifier A4. Accordingly, the output signal VOUT is output from the output terminal of the operational amplifier A4, the output signal VOUT being a voltage obtained by amplifying the voltage held by the sample and hold circuit 3 and offsetting the resulting voltage by the reference voltage REF.

Figure 6:
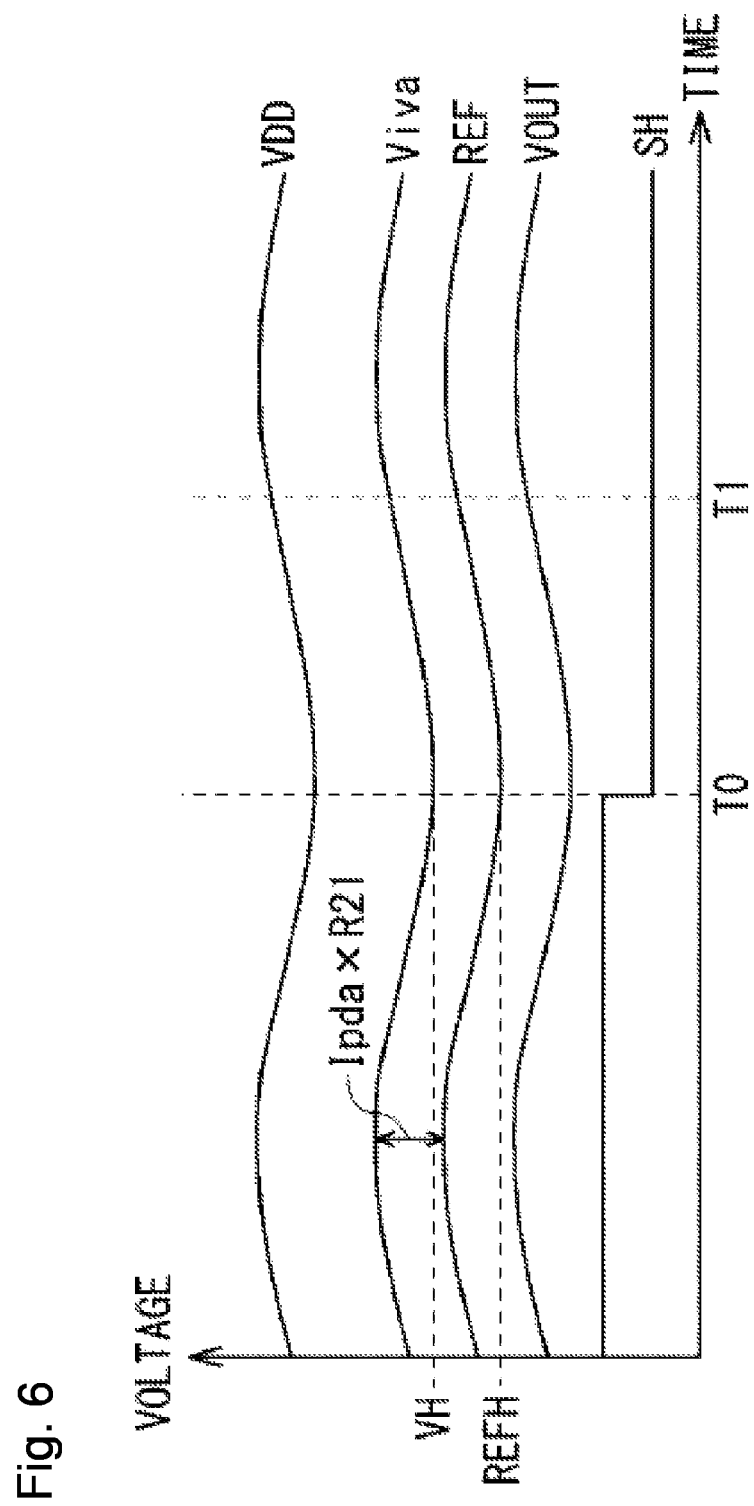
FIG. 6 is a timing chart illustrating operations of the signal processing circuit according to the first embodiment.
Figure 7:
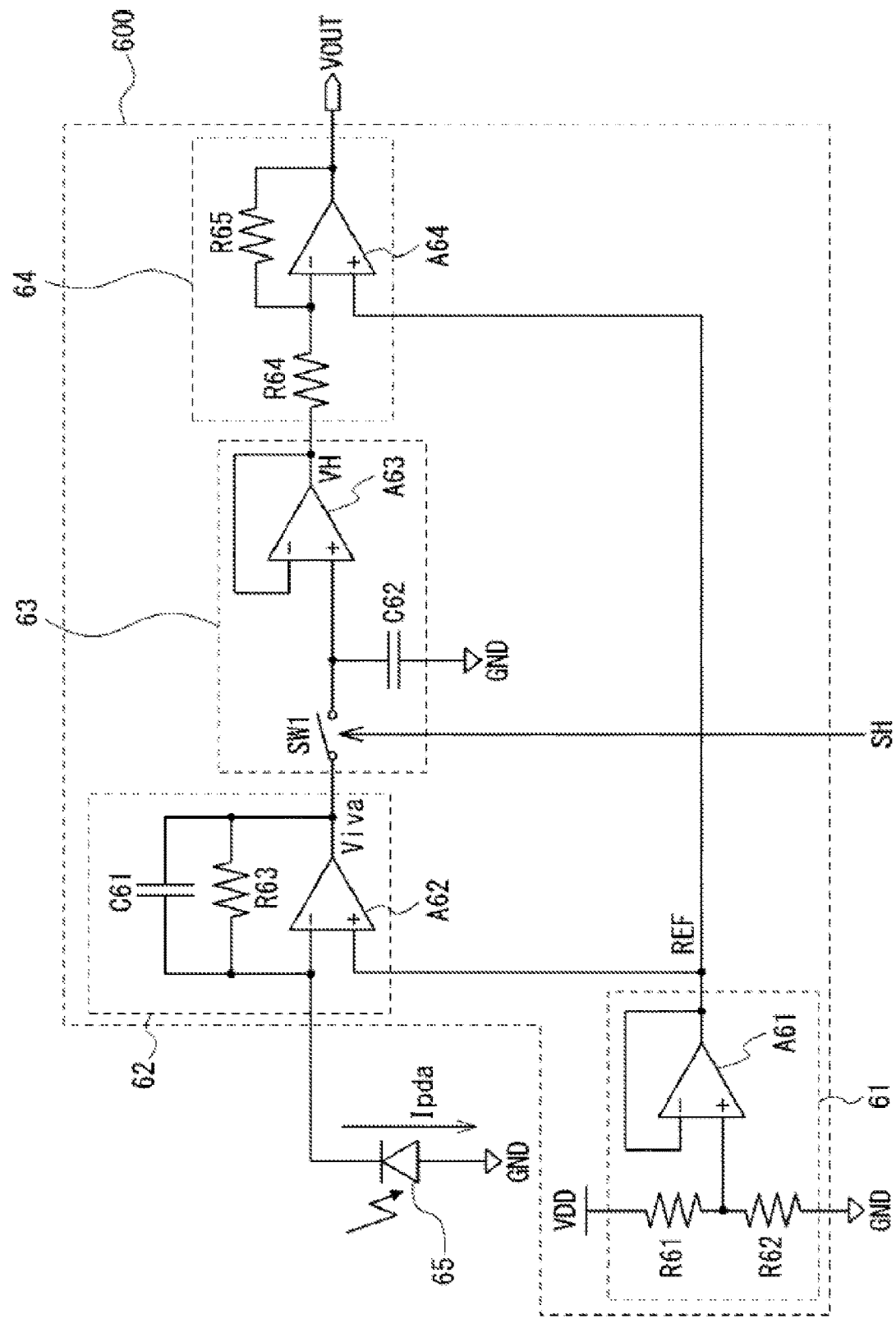
FIG. 7 illustrates an exemplary configuration of a signal processing circuit that converts a photocurrent of a photoreceiver element into a voltage signal and processes the voltage signal.
Figure 8:
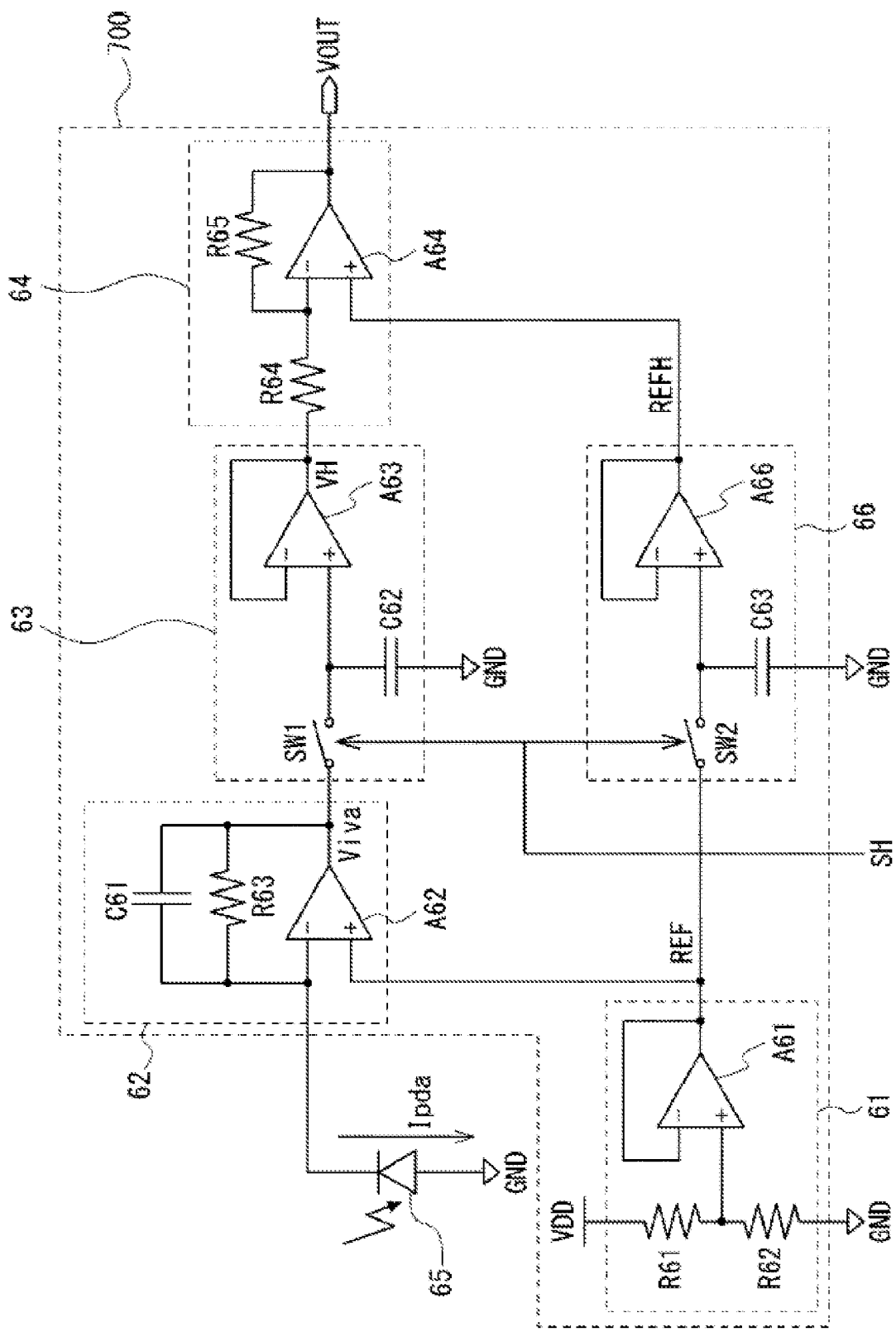
FIG. 8 illustrates another exemplary configuration of a signal processing circuit that converts a photocurrent of a photoreceiver element into a voltage signal and processes the voltage signal.

Next, operations of the signal processing circuit 100 are described. FIG. 6 is a timing chart illustrating operations of the signal processing circuit 100 according to the first embodiment. In the present embodiment, as shown in FIG. 6, when there is variation in the power supply voltage VDD, the reference voltage REF, which is generated by dividing the power supply voltage VDD, also varies in conjunction therewith.

In this example, prior to a time T0, a level of the sample and hold signal SH is HIGH and the switch SW of the sample and hold circuit 3 is closed. Accordingly, the voltage signal Viva is input to the sample and hold circuit 3.

Then, at time T0, when the level of the sample and hold signal SH transitions from HIGH to LOW, the switch SW of the sample and hold circuit 3 is opened. At this point, the reference voltage REF is input to one end of the capacitor C31 of the sample and hold circuit 3, and therefore the capacitor C31 is charged with an electric charge corresponding to a voltage Ipda·R21, where the reference voltage REF is subtracted from Viva=Ipda·R21+REF. Accordingly, as shown in Formula [5], when the switch SW is opened, the sample and hold circuit 3 holds, as a voltage signal VH, a voltage calculated by adding the reference voltage REF and the voltage Ipda·R21 from the electric charge that is charged into the capacitor C31.

$$VH=Ipda\cdot R21+REF \qquad [5]$$

As noted above, the amplifier circuit 4 is configured as an inverting amplifier having an offset that is the reference voltage REF, and therefore the output signal VOUT is expressed by the following Formula [6], where a gain determined by the resistor R41 and the resistor R42 in Formula [6] is given by G (G=−R42/R41).

$$VOUT=G(VH-REF)+REF \qquad [6]$$

At this point, the reference voltage REF input to the capacitor C31 of the sample and hold circuit 3 and the reference voltage REF input to the operational amplifier A4 of the amplifier circuit 4 vary in conjunction with each other, and therefore Formula [6] noted above can be modified to the following Formula [7].

$$VOUT=G(Ipda\cdot R21+REF-REF)+REF=G\cdot Ipda\cdot R21+REF \qquad [7]$$

As shown in Formula [7], a first element on the right side that is multiplied by the gain G is determined by the values for the resistor R21 and the photocurrent Ipda flowing to the photoreceiver element 5. Therefore, a component of the output signal VOUT affected by the gain is constant and independent of the reference voltage REF. In contrast, a second element on the left side that indicates the offset is the value for the reference voltage REF, and therefore the output signal VOUT can be understood to vary so as to track with variation of the reference voltage REF while the gain component is kept constant. Accordingly, variation in the gain of the output signal VOUT can be prevented, and a change in the photocurrent can be reflected in the output signal VOUT with a high degree of accuracy.

As described above, use of a single sampling circuit is sufficient with the present configuration, and therefore, as compared to the signal processing circuit 700 described above, an effect deriving from variation in the power supply voltage or reference voltage can be inhibited with a simpler configuration having a small circuit scale.

Moreover, in a configuration using the four-phase signal described above, such as the configuration discussed in the specification of Japanese Patent No. 5,771,070, for example, timing differs for arithmetic operations using output signals reflecting each phase. However, in the present configuration, the output signal tracks to the variation in the power supply voltage or the reference voltage, and therefore even when the arithmetic operation timing differs, variation in the reference voltage is canceled out. As a result, it can be understood that an error arising from differences in the arithmetic operation timing of each phase can be inhibited, and that position detection accuracy can be improved.

In addition, in order to perform position detection with the encoder, the output signal VOUT output from the signal processing circuit 100 may be used in an arithmetic operation carried out with another arithmetic operation device and may be compared with, for example, the reference voltage REF. At this point, as described above, variation in the output signal VOUT tracks to the variation in the reference voltage REF, which is the offset component. Accordingly, there are similar changes in the output signal VOUT relative to the reference voltage REF (to which the output signal VOUT is compared by the other arithmetic operation device). As a result, based on a result of comparing the output signal VOUT with the reference voltage REF, an effect of the variation in the reference voltage REF can be eliminated. Thereby, the encoder can perform stable position detection independent of variation in the power supply voltage or the reference voltage.

Other Embodiments

Moreover, the present invention is not limited to the embodiments described above, and may be modified as needed without departing from the scope of the present invention. For example, the configurations of the reference voltage generator circuit, the current/voltage converter circuit, the sample and hold circuit, and the amplifier circuit noted above are merely exemplary, and so long as similar functionality can be achieved, other elements may be added or other configurations may be employed.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An encoder, comprising:
   a light source;
   a lens that converts light emitted from the light source into parallel light beams;
   a scale that receives the parallel light beams from the light source;
   a photoreceiver that receives the parallel light beams from the scale and that outputs a signal corresponding to the received parallel light beams; and
   a signal processing circuit that calculates a positional relationship between the photoreceiver and the scale in accordance with the signal from the photoreceiver, wherein the signal processing circuit includes
      a reference voltage generator circuit that generates a reference voltage corresponding to a power supply voltage;
      a current/voltage converter circuit that converts a photocurrent output by a photoreceiver into voltage, and that outputs a voltage signal obtained by adding the converted voltage and the reference voltage;
      a sample and hold circuit, including a first operational amplifier, that holds a voltage of a first capacitor in response to a sample and hold signal, the first capacitor having the voltage signal output from the current/voltage converter circuit input at one end and the reference voltage input at another end, the voltage of the first capacitor being voltage at an end on a side where the voltage signal is input; and an amplifier circuit that outputs an output signal where the voltage held by the sample and hold circuit is amplified with the reference voltage as a reference, wherein the amplifier circuit includes
a second resistor having one end connected to the output terminal of the first operational amplifier;
a third operational amplifier where the reference voltage is input to one input terminal and the output signal is output from an output terminal; and
a third resistor having one end connected to the output terminal of the third operational amplifier, and
another input terminal of the third operational amplifier is connected to another end of the second resistor and another end of the third resistor.

2. The encoder according to claim 1, wherein the sample and hold circuit comprises:
a switch, to one end of which the voltage signal output from the current/voltage converter circuit is input, the switch opening and closing synchronously with the sample and hold signal; and
the first operational amplifier includes one input terminal and an output terminal that are connected, and another input terminal that is connected to another end of the switch and to one end of the first capacitor, wherein a voltage of the output terminal of the first operational amplifier when the switch is open is output as the held voltage.

3. The encoder according to claim 2, wherein:
the current/voltage converter circuit comprises:
a second operational amplifier where the reference voltage is input to one input terminal, another input terminal is connected to one end of the photoreceiver, and the voltage signal is output from an output terminal; and
a second capacitor and first resistor connected in parallel between the input terminal of the second operational amplifier that is connected to the photoreceiver, and the output terminal of the second operational amplifier.

4. The encoder according to claim 1, wherein the reference voltage generator circuit comprises:
a fourth resistor having the power supply voltage input to one end;
a fifth resistor having a fixed voltage that is lower than the power supply voltage input to one end; and
a fourth operational amplifier having one input terminal connected to another end of the fourth resistor and another end of the fifth resistor, having another input terminal connected to an output terminal, and outputting the reference voltage from the output terminal.

5. The encoder according to claim 2, wherein the reference voltage generator circuit comprises:
a fourth resistor having the power supply voltage input to one end;
a fifth resistor having a fixed voltage that is lower than the power supply voltage input to one end; and
a fourth operational amplifier having one input terminal connected to another end of the fourth resistor and another end of the fifth resistor, having another input terminal connected to an output terminal, and outputting the reference voltage from the output terminal.

6. The encoder according to claim 3, wherein the reference voltage generator circuit comprises:
a fourth resistor having the power supply voltage input to one end;
a fifth resistor having a fixed voltage that is lower than the power supply voltage input to one end; and
a fourth operational amplifier having one input terminal connected to another end of the fourth resistor and another end of the fifth resistor, having another input terminal connected to an output terminal, and outputting the reference voltage from the output terminal.

7. A signal processing circuit, comprising:
a reference voltage generator circuit that generates a reference voltage corresponding to a power supply voltage;
a current/voltage converter circuit that converts a photocurrent output by a photoreceiver, which receives light from a scale receiving parallel light beams converted by a lens, into voltage, and outputs a voltage signal obtained by adding the converted voltage and the reference voltage;
a sample and hold circuit, including a first operational amplifier, that holds a voltage of a first capacitor in response to a sample and hold signal, the first capacitor having the voltage signal output from the current/voltage converter circuit input at one end and the reference voltage input at another end, the voltage of the first capacitor being voltage at an end on a side where the voltage signal is input; and
an amplifier circuit that outputs an output signal where the voltage held by the sample and hold circuit is amplified with the reference voltage as a reference, wherein the amplifier circuit includes
a second resistor having one end connected to the output terminal of the first operational amplifier;
a third operational amplifier where the reference voltage is input to one input terminal and the output signal is output from an output terminal; and
a third resistor having one end connected to the output terminal of the third operational amplifier, and
another input terminal of the third operational amplifier is connected to another end of the second resistor and another end of the third resistor.

* * * * *